United States Patent
Heliö et al.

(10) Patent No.: US 7,158,774 B2
(45) Date of Patent: Jan. 2, 2007

(54) METHOD FOR TUNING A FILTER

(75) Inventors: Petri Heliö, Tampere (FI); Tomi-Pekka Takalo, Pirkkala (FI)

(73) Assignee: Nokia Corporation, Espoo (FI)

( * ) Notice: Subject to any disclaimer, the term of this patent is extended or adjusted under 35 U.S.C. 154(b) by 628 days.

(21) Appl. No.: 10/000,394

(22) Filed: Nov. 30, 2001

(65) Prior Publication Data

US 2002/0068541 A1 Jun. 6, 2002

(30) Foreign Application Priority Data

Dec. 4, 2000 (FI) .................................. 20002652

(51) Int. Cl.
*H04B 1/16* (2006.01)
(52) U.S. Cl. ..................... 455/340; 455/266; 455/339
(58) Field of Classification Search ................ 455/266, 455/339, 340
See application file for complete search history.

(56) References Cited

U.S. PATENT DOCUMENTS

| | | | | |
|---|---|---|---|---|
| 5,065,453 A | * | 11/1991 | Thomas | ....................... 455/286 |
| 5,193,210 A | | 3/1993 | Nicholas et al. | ............ 455/38.1 |
| 5,280,638 A | * | 1/1994 | Porambo et al. | ............. 455/143 |
| 5,287,556 A | * | 2/1994 | Cahill | ......................... 455/266 |
| 5,758,276 A | * | 5/1998 | Shirakawa et al. | ......... 455/314 |
| 5,758,296 A | * | 5/1998 | Nakamura | ............... 455/575.7 |
| 6,011,770 A | | 1/2000 | Tan | ............................. 369/124 |
| 6,097,269 A | * | 8/2000 | Hernandez | ................... 333/174 |
| 6,266,522 B1 | * | 7/2001 | Holden et al. | .............. 455/339 |
| 6,553,216 B1 | * | 4/2003 | Pugel et al. | ................. 455/340 |
| 6,778,594 B1 | * | 8/2004 | Liu | ............................. 375/222 |
| 6,823,292 B1 | * | 11/2004 | Spencer | ...................... 702/190 |
| 2003/0156052 A1 | * | 8/2003 | Hammes et al. | ............ 341/143 |

FOREIGN PATENT DOCUMENTS

| | | |
|---|---|---|
| DE | 43 29 705 | 3/1995 |
| EP | 0 475 705 | 3/1992 |

OTHER PUBLICATIONS

"Low-IF Topologies for High-Performance Analog Front Ends Of Fully Integrated Receivers", IEEE Transactions on Circuits and Systems-II: analog and Digital Signal Processing, vol. 45, No. 3, pp. 1-14.

* cited by examiner

*Primary Examiner*—Matthew Anderson
*Assistant Examiner*—Sujatha Sharma
(74) *Attorney, Agent, or Firm*—Perman & Green, LLP.

(57) ABSTRACT

The invention relates to a method for tuning a filter (5). The filter has at least one variable time constant, by which the location of the pass band (pc) of said at least one filter can be changed. In the method, at least one reference signal is inputted in said filter (5), and the frequency of said at least one reference signal is changed, and/or said at least one time constant of the filter (5) is changed. The method also comprises the steps of measuring the strength of the output signal of the filter (5) and determining, on the basis of the measurement on the strength of the output signal of the filter (5), the location of the pass band of said filter (5).

9 Claims, 4 Drawing Sheets

METHOD FOR TUNING A FILTER

The present invention relates to a method for tuning a filter as presented in the preamble of the appended claim 1. The invention also relates to a filter according to the preamble of the appended claim 8, an electronic device according to the preamble of the appended claim 10, as well as a wireless communication device according to the preamble of the appended claim 19.

Figure 1B:
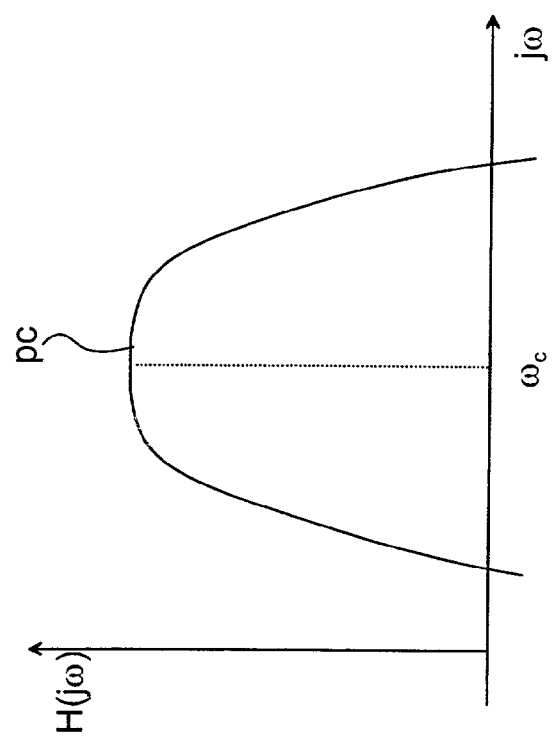
Figure 1A:
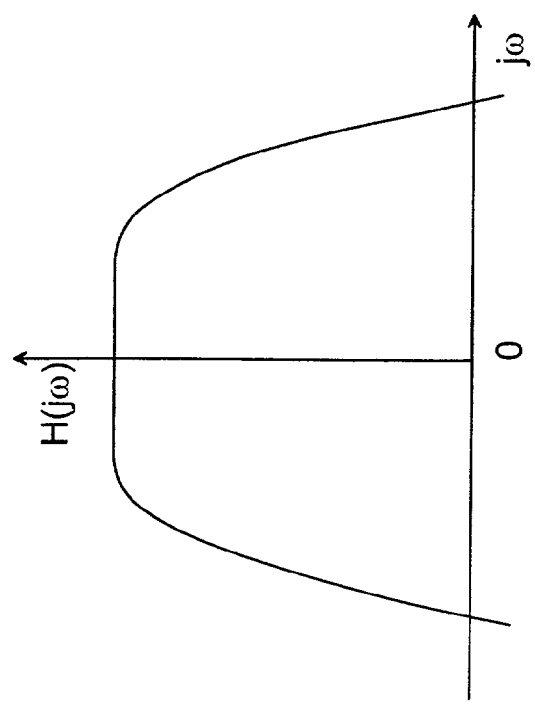

Filters are used for processing various signals in a number of electronic devices. Filters can be divided according to the frequency response of the filter, that is, how the filter passes certain frequencies. Low-pass filters are known, in which signals above a certain limit frequency are filtered off an incoming signal. Accordingly, a high-pass filter is used for filtering off signals under a certain limit frequency. A band-pass filter passes signals within the range of a certain pass band and, accordingly, a band-reject filter is used to reject the pass of signals within a certain frequency range through the filter. The low-pass filter has a frequency response $H_{LP}(j\omega)=1/(1+j\omega\tau)$. The band pass filter can be implemented for example from the low-pass filter by shifting the pass band to a desired medium frequency. Thus, the real properties of the low-pass filter are maintained. A band pass filter implemented in this way has a pass band both in the positive frequency range and in the negative frequency range. This can also be expressed as the following modification: $j\omega \rightarrow j\omega_c(\omega/\omega_c - \omega_c/\omega)$. In this case, the band pass filter has a frequency response, in which the medium frequency is at locations $\omega = \pm \omega_c$. In addition to real filters, complex filters have been developed. These can be produced by a linear conversion $(j\omega \rightarrow j\omega - j\omega_c)$, in which the frequency band of a real low pass filter is shifted to a desired medium frequency. Such a complex filter has thus one pass band $H_{BP}(j\omega)=1/(1+(j\omega-j\omega_c)\tau)$ at the positive frequency $\omega=+\omega_c$. The band width of the pass band is substantially the same as the band width of the low pass filter. In particular, complex filters are used for selective filtering of positive or negative frequencies of a real or complex signal. FIG. 1a shows the frequency response of a real low pass filter, and FIG. 1b shows the frequency response of a complex band pass filter. A complex band pass filter and the pass band of the complex band pass filter can also be referred to as a complex resonator.

The transfer function of a real low-pass filter of the first degree can be presented in the form $H_{LP}(j\omega)=1/(1+j\omega\tau)$ and, correspondingly, the transfer function of a complex band pass filter of the second degree can be presented in the form $H_{BP}(j\omega)=1/(1+(j\omega-j\omega_c)\tau)$. Since a real filter must always have at least one complex conjugate pole pair, the real filter will form a low pass filtering function whose medium frequency is at the zero frequency. The complex filter has a low pass filtering capacity where the medium frequency is a frequency $\omega_c$. Since the complex filter has a pass band on only one side of the zero frequency axis, the complex filter will, in practice, form a complex band pass filtering function whose medium frequency is at the frequency $\omega_c$. A time constant $\tau$ determines the limit frequency $(j\omega\tau)$ and the medium frequency $(j\omega_c\tau)$ of the pass band of the complex filter. If the time constant $\tau$ is changed in the case of the complex filter, both the limit frequency and the medium frequency will be changed, but the quality value (Q value) of the complex filter will remain unchanged. Comparing FIGS. 1a and 1b, it is found that the properties of the complex filter differ from the properties of the real filter. This is one reason why complex filters and real filters can be tuned in different ways.

With the degree of integration of electronic devices increasing and the size demands becoming stricter also in other respects, filters are increasingly implemented by means of integrated circuit solutions. However, the filter requires the formation of time constants, which is, in practice, often implemented by using resistors and capacitors. In practice, the tolerances of resistors and capacitors formed on integrated circuits are relatively high, wherein the frequency response of filters implemented on integrated circuits may vary significantly even in different integrated circuits of the same production run. This is one reason why filters implemented with integrated circuits and requiring high precision are, in practice, implemented as adjustable filters. However, the adjustment of prior art filters is problematic, for example for the reason that the space required by the components used for tuning on the integrated circuit is relatively large, and/or external components must be used in the tuning. Furthermore, some prior art tuning methods involve the problem that they increase the power consumption of the electronic device to a significant degree. The tunability normally also increases the manufacturing costs and increases the time required for the production. In practice, the tuning of filters in real filters of prior art is implemented for example by changing the capacitance of a tuning capacitor formed on the integrated circuit by means of a laser beam. In practice, this tuning must be made at the stage of manufacturing the device, and this method is also slow and expensive. Moreover, in this method it is not possible to repeat the tuning or to tune during the use. In tuning methods of prior art, it is also not possible to take into account the effect of changes in the ambient temperature on the frequency response of the filter.

It is an aim of the present invention to provide a method for tuning a filter. The invention is based on the idea that for tuning a filter, a reference signal is input in the filter, the strength of the signal at the output of the filter is measured, and the frequency of the reference signal and/or the time constant of the filter and/or the frequency of the resonator are adjusted, until it can be determined from the output signal of the filter that the tuning is in order. More precisely, the method according to the present invention is characterized in what will be presented in the characterizing part of the appended claim 1. The filter according to the present invention is primarily characterized in what will be presented in the characterizing part of the appended claim 8. The electronic device according to the present invention is primarily characterized in what will be presented in the characterizing part of the appended claim 10. The wireless communication device according to the present invention is primarily characterized in what will be presented in the characterizing part of the appended claim 19.

Considerable advantages are achieved by the present invention when compared with solutions of prior art. Using the method of the invention, a filter, such as a complex filter, can be tuned without a need for external components, because the filter and the components needed for the tuning are placed on an integrated circuit. Also, the tuning precision becomes better and faster than in tuning methods of prior art.

Furthermore, no external test signals will be needed in connection with the tuning, because the system is a self-tunable one. Moreover, the tuning can be automatically performed at intervals or for example when the device is turned on. The method according to the invention makes it possible, for example, to use a complex filter instead of e.g. an intermediate frequency filter, wherein it is possible to reduce the size of a wireless communication device and to save circuit area. The present invention also improves the reliability and quality of the filter and the devices using the filter. In addition, it is possible to save on installation and production costs, because there is no need for tuning of the filters at the production stage. Moreover, the fact that no external tuning components are needed in connection with the filter of the invention increases the reliability of the device, because the solderings of such external components may be disconnected as the device becomes older and is subjected to possible impacts and vibration. The filter according to the invention is also more stable with respect to the temperature, wherein it is not so susceptible to variations in the temperature. The tuning method according to the invention can be used to imprpove the signal quality.

Figure 2:
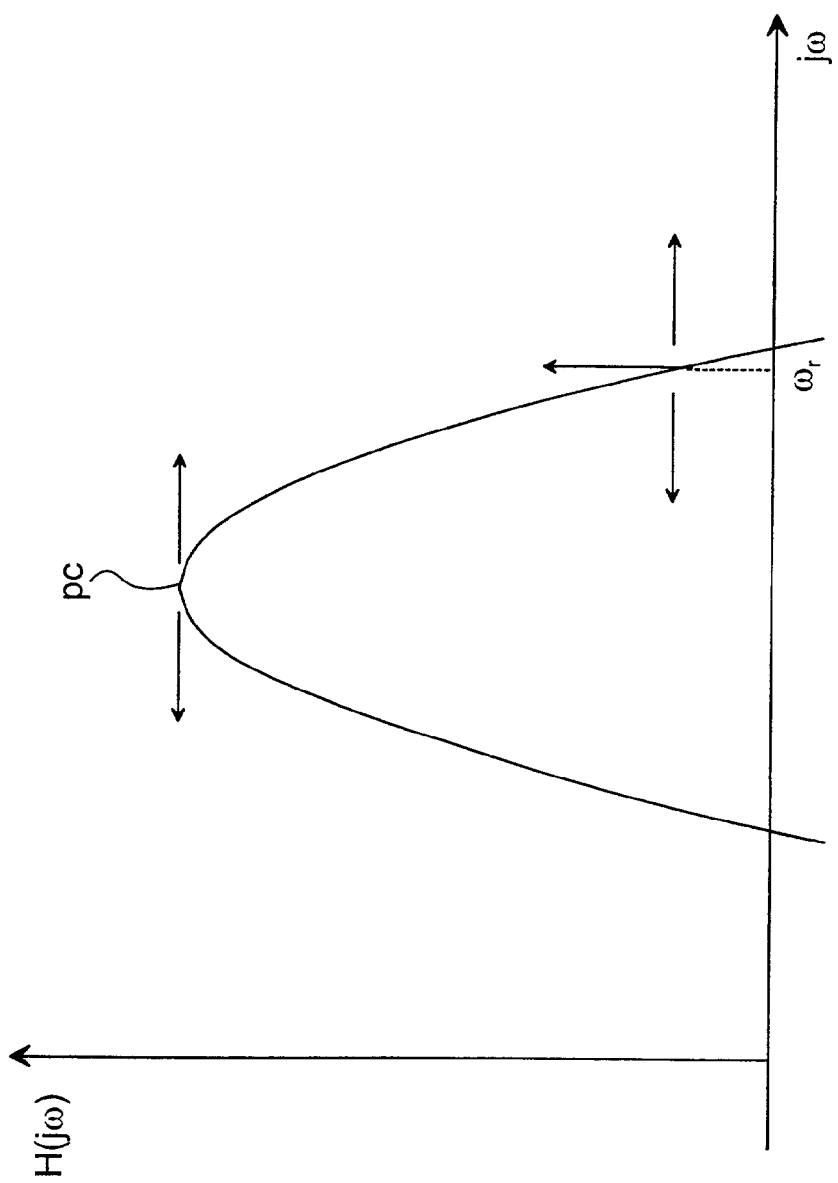
Figure 3:
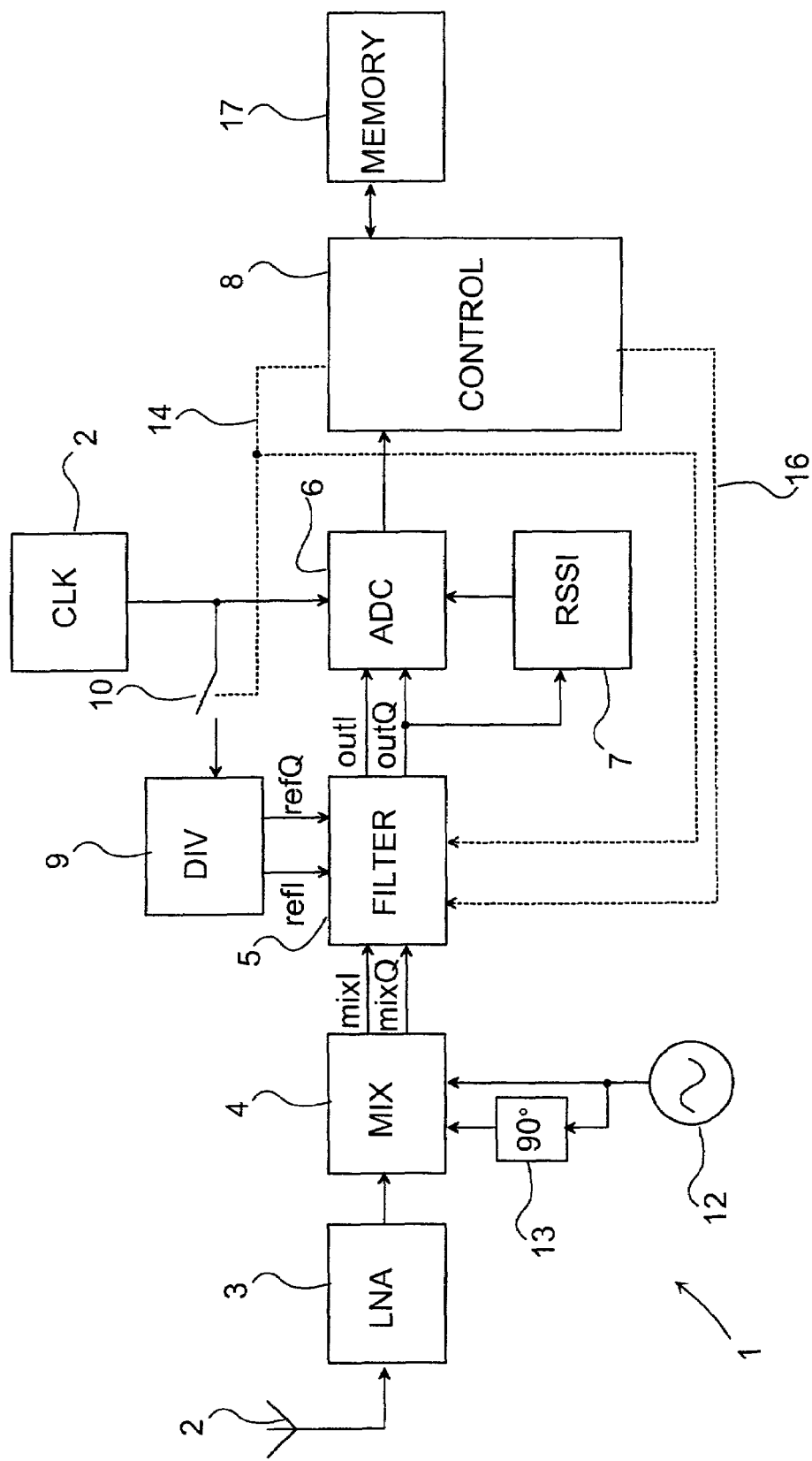
Figure 4:
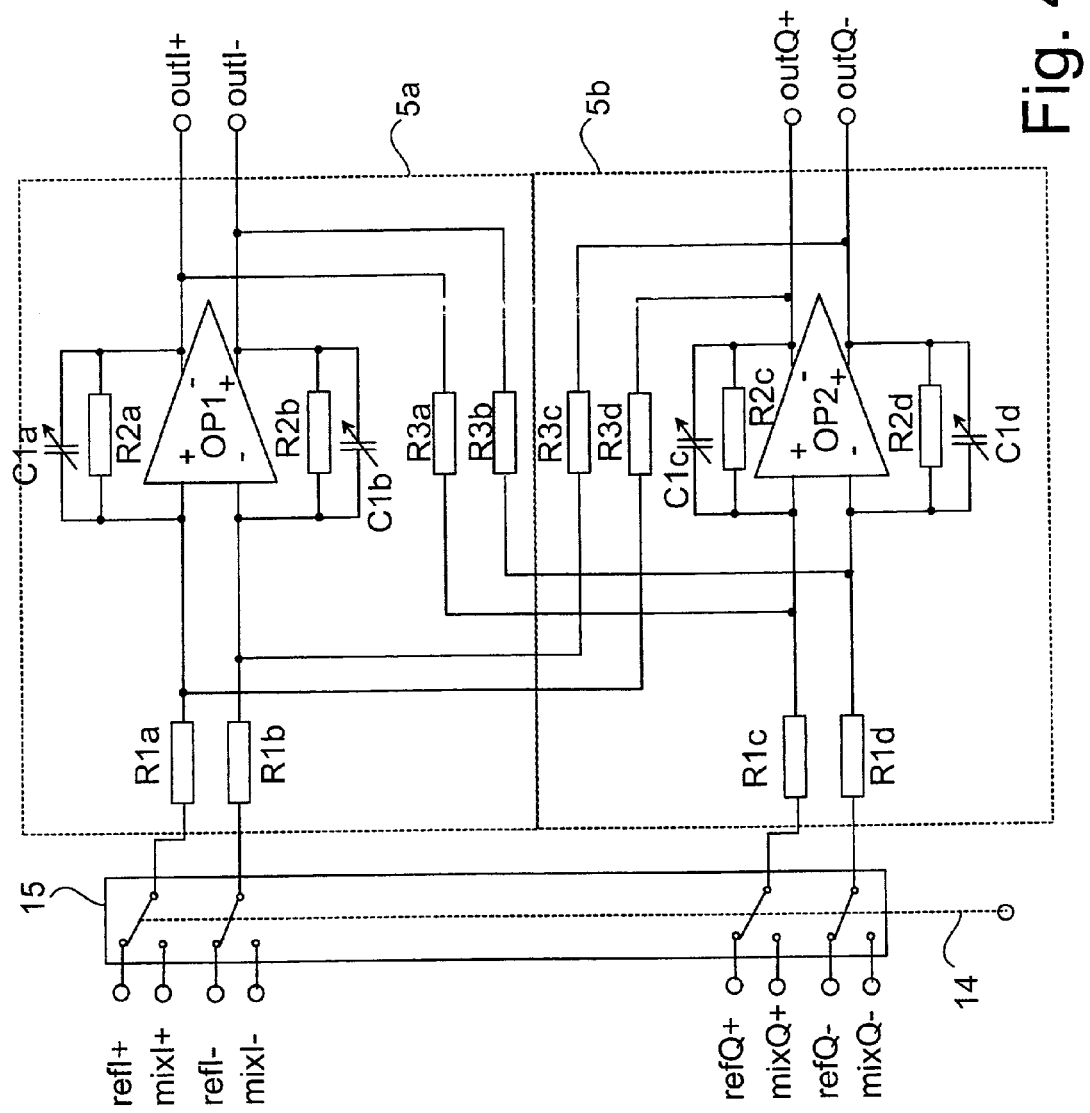

In the following, the present invention will be described in more detail with reference to the appended drawings, in which FIG. 1a illustrates the frequency response of a real low-pass filter, FIG. 1b illustrates the frequency response of a complex band pass filter, FIG. 2 shows a method according to a preferred embodiment of the invention for searching the pass band of a complex band pass filter in a frequency/amplitude coordinate system, FIG. 3 shows a receiver in an electronic device according to a preferred embodiment of the invention in a reduced block chart, FIG. 4 shows the circuit diagram of a complex filter according to a preferred embodiment of the invention.

The following is a description of a receiver 1 in an electronic device according to a preferred embodiment of the invention, such as a wireless communication device, as illustrated in FIG. 3. The receiver 1 comprises an antenna 2, via which a signal is received and led to a low-noise high-frequency amplifier 3 (LNA) for amplification. The amplified signal is led to a mixer 4. In the mixer 4, the amplified signal is mixed with a local oscillator signal generated by a local oscillator 12. From this local oscillator signal, also another local oscillator signal is advantageously formed in a phase shift block 13, the signal having the same frequency but a phase shift of about 90° compared with the signal generated by the local oscillator. Thus, the output of the mixer 4 provides either a signal at an intermediate frequency or a baseband signal, comprising two signals of different phases. Such signals are normally referred to as quadrature signals I (in-phase) and Q (quadrature phase). The quadrature signals formed as a result of the mixing, preferably differential quadrature signals mixI+, mixI−, mixQ+, mixQ− are led to the filter 5 for filtering. The output of the filter 5 preferably provides a differential quadrature signal outI+, outI−, outQ+, outQ− which is influenced e.g. by the frequency response of the filter. If an intermediate frequency signal is formed in the filter 4, the aim is to reject in the filter 5 the signals outside the desired pass band from this intermediate frequency signal. The filter 5 is thus used as a band pass filter whose pass band is attempted to be set to an intermediate frequency. The medium frequency and width of the pass band can be changed, as will be presented below in this description. The signal output from the filter 5 is led to an analog-to-digital converter 6 (ADC) in which digital samples are formed of the signal. Furthermore, the filtered signal is led to a received signal strength indicator 7 (RSSI). The purpose of the received signal strength indicator 7 is to generate a signal proportional to the strength of the received signal, to eliminate the effect of variations in the strength of the received signal on the expression of payload information. The analog-to-digital converter 6 can comprise separate converter blocks for converting the filtered signal and the signal generated by the received signal strength indicator 7 to digital format, or if the analog-to-digital converter comprises no separate converters, a switch or the like (not shown) can be used to lead the respective signal for conversion. A clock signal CLK is used to control the sampling moments and sampling frequency of the analog-to-digital converter. The digital samples are led to a control block 8 which comprises e.g. a base frequency part for the receiver (not shown).

In the control block 8, the steps of further processing of the received signal converted into digital format are taken in a way known as such. Furthermore, e.g. samples taken of the signal generated by the received signal strength indicator 7 are examined and; on the basis of them, possible variations in the signal strength are determined in the control block 8. These variations in the signal strength can be eliminated from the digitized payload signal for example by multiplying the samples, if necessary. Another possibility is to adjust the amplification of the amplifier 2 on the basis of the signal strength data.

The filter 5, whose one advantageous embodiment is shown in FIG. 4, is preferably a complex band pass filter, but the tuning method according to the invention can also be applied in connection with other kinds of filters. The filter 5 according to an advantageous embodiment of the invention, shown in FIG. 4, comprises substantially identical filter blocks 5a, 5b. The signals are preferably led as differential signals to the filter blocks 5a, 5b, and the output signals of the filter are preferably differential signals. However, it is obvious that the present invention can also be applied in connection with other signals than differential quadrature signals. The purpose of the first filter block 5a is to filter the first signal mixI+, mixI−, refI+, refI− and, correspondingly, the purpose of the second filter block 5b is to filter the second, phase-shifted signal mixQ+, mixQ−, refQ+, refQ−. Thus, the differential output outI+, outI− of the first filter block 5a provides a band-pass filtered I signal and, correspondingly, the differential output outQ+, outQ− of the second filter block 5b provides a band-pass filtered Q signal. The frequency of the band-pass filtered I and Q signals is either in the negative frequency range or in the positive frequency range.

In this preferred embodiment, the filter blocks 5a, 5b comprise a differential amplifier 11a, 11b, resistors R1a, R1b, R2a, R2b, R3a, R3b; R1c, R1d, R2c, R2d, R3c, R3d, and capacitors C1a, C1b, C1c, C1d. It is assumed that the resistances of the resistors R1a, R1b, R1c, R1d are substantially the same, wherein, for clarity, the reference R1 can also be used for these resistors. In a corresponding manner, the resistances of the resistors R2a, R2b, R2c, R2d are also substantially the same, wherein the reference R2 can also be used for these resistors; likewise, the resistances of the resistors R3a, R3b, R3c, R3d are substantially the same, wherein also the reference R3 can be used for these resistors. Furthermore, it is assumed that the capacitances of the capacitors C1a, C1b, C1c, C1d are substantially the same, wherein, for clarity, the reference C1 can also be used for these capacitors. The band width of the band pass filter is determined on the basis of the resistor R1 and the capacitor C1. Correspondingly, the medium frequency of the band pass filter (resonator) is determined on the basis of the resistor R3 and the capacitor C1. The quality value Q can be expressed by means of the resistors R1, R3 and the capacitor C1 in the following way: $R3C1/R1C1 = R3/R1$. The quality value is thus independent of the capacitance of the capacitor C1; that is, the quality value is constant, when the resistors R1, R3 are invariable. The limit frequency and amplification of the complex filter is determined by the values of the resistors R1a, R1b, R2a, R2b, R3a, R3b; R1c, R1d, R2c, R2d, R3c, R3d, and capacitors C1a, C1b, C1c, C1d. Correspondingly, the medium frequency of the filter is determined on the basis of the resistor R3a, R3b, R3c, R3d and the capacitor C1a, C1b, C1c, C1d. The filter 5 of FIG. 4 is arranged to be adjusted e.g. by using active RC filter technique so that the capacitor C1a, C1b, C1c, C1d is an adjustable capacitor whose capacitance can be changed. Another alternative is that the filter 5 is provided with a set of capacitors, of which it is possible to select the capacitors required each time. In this alternative, the capacitances of the capacitors are preferably weighted in involutions of two; that is, for example when four capacitors are used, the capacitance of one capacitor is 1C (C is e.g. 1 pF), the capacitance of the second capacitor is 2C, the capacitance of the third capacitor is 4C, and the capacitance of the fourth capacitor is thus 8C. Thus, with all the selection combinations, it is possible to adjust the capacitance within a range from 0 to 15C with steps of 1C. The selection of capacitances can thus be implemented with n number of binary selection lines, where n=the number of capacitors that can be selected.

Both the filter blocks 5a, 5b should be as identical as possible in their electrical operation, to avoid mutual distortion of the quadrature signals. Thus, the components corresponding to each other in the different filter blocks 5a, 5b, particularly the resistors and the capacitors, should be as identical as possible. In integrated circuits, this item can be taken into account in the geometrical design of the circuit. Thus. e.g. the resistances of the resistors R1a, R1b, R1c, R1d are substantially the same. In a corresponding manner, the resistances of the resistors R2a, R2b, R2c, R2d are also substantially the same, and the resistances of the resistors R3a, R3b, R3c, R3d are substantially the same. Furthermore, the capacitances of the capacitors C1a, C1b, C1c, C1d are substantially the same.

The following is a description on the method according to an advantageous embodiment of the invention in a receiver 1 according to FIG. 3, applying a complex filter 5 of FIG. 4. From the control block 8, a selection signal is led via the selection line 14 to the complex filter at the stage when the complex filter is to be adjusted. This selection signal is used to set a switch 10 in a position in which the clock signal is led to a divider circuit 9. In the divider circuit 9, two differential reference signals refI+, refI−; refQ+, refQ− having the same frequency but a different phase are formed of the clock signal. These differential reference signals refI+, refI−; refQ+, refQ− have a phase difference of preferably about 90°. Furthermore, a switching block 15 is preferably arranged in connection with the input lines of the filter, to select as the signal to be led to the filter 5 either the signals mixI+, mixI−, mixQ+, mixQ formed by the mixer 3 or the reference signals refI+, refI−, refQ+, refQ− formed by the divider circuit 9. The position of the switches in the switching block is preferably controlled by said signal of the selection line 14.

At the stage when the tuning of the complex filter is to be performed, the reference signals refI+, refI−, refQ+, refQ− formed in the divider circuit 9 and having different phases are led to the complex filter 5. The first reference signal refI+, refI− formed in the divider 9 is led to the first differential input inI+, inI− of the complex filter 5. In a corresponding manner, the second reference signal refQ+, refQ− formed in the divider 9 is led to the second differential input inQ+, inQ− of the complex filter 5. The signal coming from the mixer 3 is thus not led to the filter blocks 5a, 5b during the tuning.

It is assumed that the tuning is performed by keeping the frequency of the clock signals substantially constant and by adjusting the capacitance of the capacitors C1a, C1b, C1c, C1d. The clock signals supplied from the divider 9 are filtered in the complex filter 5. During tuning of the filter, the strength of the output signal of the complex filter 5 is examined. The output signal is the first differential output signal outI+, outI− or the second differential output signal outQ+, outQ−, or both. The output signal is led either directly to the analog-to-digital converter 6, wherein the signal strength can be determined directly from digital samples taken from the output signal, or the output signal is first led to a received signal strength indicator 7, which produces a signal that is converted to digital format in the analog-to-digital converter 6, wherein the signal strength can be determined from digital samples taken from the signal formed by the received signal strength indicator 7. The digitized signal is examined in the control block 8. The aim is to locate one or more complex resonators. To do this, the control block 8 changes the value of the tuning signal of a tuning line 16. By changing the value of this tuning signal, the capacitance of the capacitor C1a, C1b, C1c, C1d will be changed. This change in the capacitance will produce a change in the time constants of the filter blocks 5a, 5b of the filter 5, wherein also the location of the complex resonator will be changed. After this, the control block 8 compares the value of the signal used for tuning with the previous measurement result. If the comparison shows that the signal strength was increased, it is assumed that the change in the tuning signal caused a change to the correct effect in the location of the complex resonator. FIG. 2 illustrates this tuning. The frequency of the reference signal is illustrated with a broken line at the point $\omega_r$, and the complex resonator is illustrated with a line indicated with the reference pc. A change in the capacitance value will change the location of the complex resonator in the direction of the frequency axis $j\omega$. As illustrated in FIG. 2, a change towards the frequency of the reference signal will increase the strength of the output signal from the complex filter. In a corresponding manner, if a change in the tuning signal causes that the complex resonator is moved farther away from the reference signal frequency, the strength of the output signal from the complex filter is reduced. In this case, the control block 8 will change the value of the tuning signal in the other direction, wherein the complex resonator will also move in a different direction than by the preceding change in the tuning signal. This changing of the tuning signal will be iterated as long as the maximum signal strength is found. This maximum indicates the correct tuning; i.e. the complex resonator is set substantially at the frequency of the reference signal. In this way, the complex resonator can be set in a desired location, if the frequency of the reference signal is suitably selected. On the other hand, even if the frequency of the reference signal used for tuning did not correspond to the location desired for the complex resonator, the data found out by means of the reference signal can be utilized for precise tuning of the complex resonator. This can be done e.g. by calculations, when the location of the complex resonator is known at a specific value of the tuning signal.

The capacitors C1a, C1b, C1c, C1d used are preferably capacitors adjustable by voltage (varactors), wherein the tuning signal used is a voltage signal. This voltage signal can be formed in a way known as such, e.g. by a digital-to-analog converter (not shown).

Another alternative for the tuning is to change the frequency of the clock signal of the reference signal and to keep the capacitance of the capacitor C1 constant. On the basis of the signal strength, it is thus possible to determine, at which clock frequency the signal strength has its maximum. On the basis of this information, it is possible to find out the location of the complex resonator and to tune the complex filter by determining the deviation of the location of the complex resonator from the target location and by calculating the value of the tuning signal required for correcting this deviation, preferably a voltage change in the tuning line 16, if the capacitors C1a, C1b, C1c, C1d used are capacitors adjustable by voltage. In a corresponding manner, if the capacitors C1a, C1b, C1c, C1d used are capacitors with constant capacitance and selection switches, such as MOS switches (not shown), control data producing the desired capacitance value, such as a binary digit with n bits, is set in the tuning line.

It is obvious that the above-mentioned two different tuning methods can also be combined, wherein both the frequency of the reference signal and the value of the tuning signal are changed.

Although the above description only presented the tuning of one complex filter consisting of a single complex resonator, the invention can also be applied for tuning complex filters 5 which comprise more than one complex resonator. In such a case, the aim of the tuning is to find several maximum values for the signal strength, if the complex resonators are tuned at different frequencies. On the other hand, the complex resonators can also be tuned at substantially the same frequency, wherein the aim is to find one maximum value which indicates the location of the pass band of these resonators. Using the tuning method according to the invention, it is possible to significantly improve the capacity of such a complex filter 5. The quality value of the complex resonator is the higher, the higher the quality value of one resonator is and the more resonators there are one after another. This means that the quality value of several complex resonators is higher (better) than the quality value of a single complex resonator. In complex filters 5 comprising several complex resonators, the tuning is easier to perform, because variations in the strength of the output signal of such a complex filter 5 are greater than in a complex filter comprising only a single complex resonator.

The tuning can also be performed by first setting the value of the tuning signal to a first limit value, e.g. a minimum value. After this, the value of the tuning signal is increased and the strength of the output signal of the complex filter is measured. These operations are iterated, until the tuning signal has reached a second limit value, e.g. a maximum value.

During the tuning, the control block 8 examines the strength of the output signal at different values of the tuning signal and stores such values of the tuning signal which had a maximum point in the output signal, in a memory 17. By this method, it is possible to locate the pass bands of several complex resonators in the complex filter 5. On the other hand, it is possible to use more than one tuning line to search the pass bands of several complex resonators, wherein at least one complex resonator can be tuned on each tuning line by applying the above-presented method.

After tuning of the filter, the control block sets a value in the tuning line 16, by which the pass band of the complex filter is set at a desired point. In a corresponding manner, when several tuning lines are used, a value is set in each tuning line, by which the pass band of the respective complex resonator can be tuned. Furthermore, the control block 8 sets the selection line 14 in a state in which the selection switch 10 does not pass the clock signal to the divider circuit 9. Also, the switching block 15 is set in a state in which the signals mixI+, mixI−, mixQ+, mixQ− formed by the mixer 3 are led to the complex filter, after which the receiver can be used for receiving a payload signal again.

The tuning according to the invention can be repeated, if necessary. The tuning can be performed for example when the device is turned on. The tuning can also be performed at determined intervals. Because the tuning can also be performed during the use of the receiver, the operation of the receiver can be made more reliable. Furthermore, various differences caused by production tolerances and changes due to variations in temperature can be compensated by using the tuning method according to the invention.

The complex filter according to the invention can be applied in a variety of electronic devices. The above-presented receiver application is only a non-restricting example of the uses of a complex filter according to the invention. The invention can be applied e.g. in wireless communication devices, short-range radio communication means, examples of which to be mentioned include so-called Bluetooth radio communication means and a wireless local area network (WLAN). The invention can be advantageously applied in receivers using a low intermediate frequency. In this case, the signal is converted to an intermediate frequency signal in the mixer 4.

It is obvious that the present invention is not limited solely to the above-presented embodiments, but it can be modified within the scope of the appended claims.

The invention claimed is:

1. An electronic device which comprises at least one complex filter comprising at least one variable time constant by which the location of the pass band of said at least one filter can be changed, wherein the electronic device further comprises means for inputting at least one reference signal in said filter comprising an in-phase component and a quadrature phase component, means for changing the frequency ratio between said reference signal and said at least one time constant, and means for measuring the strength of the output signal of the filter, without converting the signal into another frequency before the measurement, at different frequency ratios between said reference signal and said at least one time constant, wherein the location of the pass band of said filter is arranged to be determined on the basis of the measurement of the strength of the output signal of the filter and the frequency ratio between said reference signal and said at least one time constant.

2. The electronic device according to claim 1, wherein it comprises means for searching a maximum point for at least one output signal on the basis of the measurements.

3. The electronic device according to claim 2, wherein it comprises means for changing the frequency of said reference signal for searching at least one maximum point, wherein the frequency of said reference signal at said maximum point indicates the location of the pass band of the filter.

4. The electronic device according to claim 2, wherein it comprises means for changing the time constant of said at least one filter for searching at least one maximum point, wherein the frequency of said reference signal and said time constant at said maximum point indicate the location of the pass band of the filter.

5. The electronic device according to claim 3, wherein the means for changing the time constant of said at least one filter comprise an adjustable capacitor.

6. The electronic device according to claim 4, wherein the means for changing the time constant of said at least one filter comprise at least one capacitor, and selection means for connecting said at least one capacitor in a disconnectable manner to said time constant of the filter.

7. The electronic device according to claim 1, wherein it comprises means for tuning the filter automatically.

8. The electronic device according to claim 7, wherein the means for tuning the filter automatically comprise means for tuning the filter at intervals.

9. A wireless communication device which comprises at least one complex filter comprising at least one variable time constant by which the location of the pass band of said at least one filter can be changed, wherein the wireless communication device further comprises means for inputting at least one reference signal in said filter comprising an in-phase component and a quadrature phase component, means for changing the frequency ratio between said reference signal and said at least one time constant, and means for measuring the strength of the output signal of the filter, without converting the signal into another frequency before the measurement, at different frequency ratios between said reference signal and said at least one time constant, wherein the location of the pass band of said filter is arranged to be determined on the basis of the measurement of the strength of the output signal of the filter and the frequency ratio between said reference signal and said at least one time constant.

* * * * *